US010607990B2

(12) United States Patent
Ando et al.

(10) Patent No.: US 10,607,990 B2
(45) Date of Patent: Mar. 31, 2020

(54) FABRICATION OF FIELD EFFECT TRANSISTORS WITH DIFFERENT THRESHOLD VOLTAGES THROUGH MODIFIED CHANNEL INTERFACES

(71) Applicant: INTERNATIONAL BUSINESS MACHINES CORPORATION, Armonk, NY (US)

(72) Inventors: Takashi Ando, Tuckahoe, NY (US); Ruqiang Bao, Wappingers Falls, NY (US); Hemanth Jagannathan, Niskayuna, NY (US); ChoongHyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/590,627

(22) Filed: May 9, 2017

(65) Prior Publication Data

US 2018/0331096 A1     Nov. 15, 2018

(51) Int. Cl.
*H01L 27/088* (2006.01)
*H01L 27/098* (2006.01)
*H01L 21/8234* (2006.01)
*H01L 21/28* (2006.01)

(52) U.S. Cl.
CPC .... *H01L 27/0886* (2013.01); *H01L 21/28185* (2013.01); *H01L 21/823412* (2013.01); *H01L 21/823487* (2013.01); *H01L 27/088* (2013.01); *H01L 27/098* (2013.01)

(58) Field of Classification Search
CPC ......... H01L 29/42364; H01L 29/42324; H01L 29/4234; H01L 27/0886; H01L 27/088; H01L 21/82345; H01L 21/823412; H01L 21/324; H01L 27/098
See application file for complete search history.

(56) References Cited

U.S. PATENT DOCUMENTS

| | | | |
|---|---|---|---|
| 9,041,082 B2 | 5/2015 | Dubourdieu et al. | |
| 9,337,109 B2 | 5/2016 | Doornbos et al. | |
| 9,397,199 B1 | 7/2016 | Kwon et al. | |
| 9,425,105 B1 * | 8/2016 | Basker | H01L 21/823821 |
| 9,589,806 B1 * | 3/2017 | Bao | H01L 21/283 |
| 9,748,145 B1 * | 8/2017 | Kannan | H01L 29/66545 |

(Continued)

OTHER PUBLICATIONS

Wang et al., "Desorption kinetics of GeO from GeO2/Ge Structure," Journal of Applied Physics, vol. 108, Issue 5. Sep. 2010. pp. 1-9.

*Primary Examiner* — Edward Chin
(74) *Attorney, Agent, or Firm* — Tutunjian & Bitetto, P.C.; Vazken Alexanian

(57) ABSTRACT

A method of fabricating a plurality of field effect transistors with different threshold voltages, including forming a cover layer on a channel region in a first subset, forming a first sacrificial layer on two or more channel regions in a second subset, forming a second sacrificial layer on one of the two or more channel regions in the second subset, removing the cover layer from the channel region in the first subset, forming a first dummy dielectric layer on the channel region in the first subset, and forming a second dummy dielectric layer on the first dummy dielectric layer and the first sacrificial layer on the channel region in the second subset.

15 Claims, 13 Drawing Sheets

(56) References Cited

U.S. PATENT DOCUMENTS

| | | | |
|---|---|---|---|
| 9,870,953 B2* | 1/2018 | Ando | H01L 21/823807 |
| 9,911,736 B1* | 3/2018 | Zang | H01L 27/0886 |
| 2009/0001526 A1* | 1/2009 | Feustel | H01L 21/76829 |
| | | | 257/635 |
| 2015/0380408 A1 | 12/2015 | Hong et al. | |
| 2016/0336428 A1* | 11/2016 | Cheng | H01L 29/66795 |

\* cited by examiner

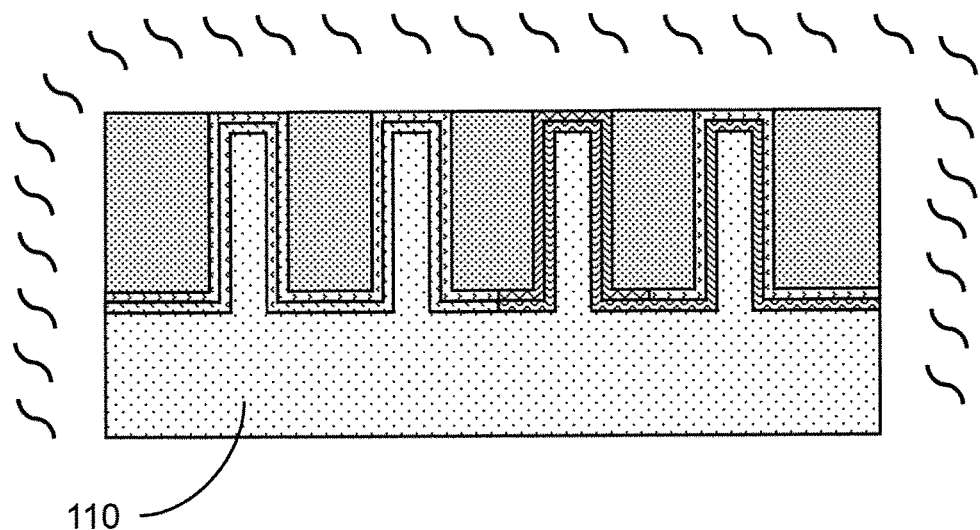
FIG. 9
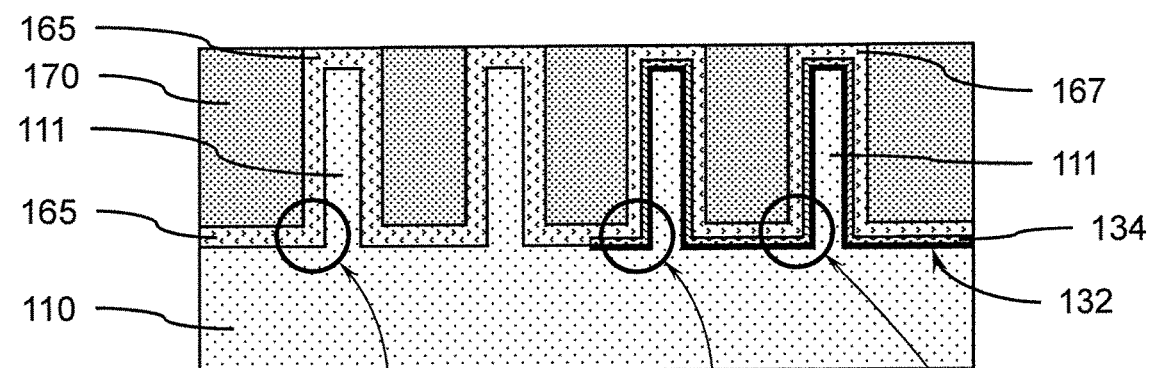
FIG. 10
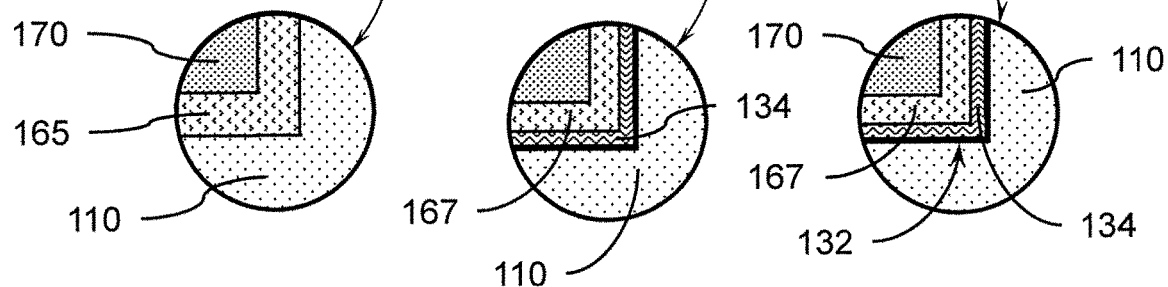

FABRICATION OF FIELD EFFECT TRANSISTORS WITH DIFFERENT THRESHOLD VOLTAGES THROUGH MODIFIED CHANNEL INTERFACES

BACKGROUND

Technical Field

The present invention generally relates to the fabrication of multiple fin field effect transistors (FinFETs) having different threshold voltages by modifying the FinFETs' channel interfaces, and more particularly to modifying the germanium concentration of the device channels at the interface of the vertical fins with a sacrificial structure.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin approximately rectangular Si, commonly referred to as the fin with a gate on the fin, as compared to a metal-oxide-semiconductor field effect transistor (MOS-FET) with a gate parallel with the plane of the substrate.

Depending on the doping of the source and drain, an n-type FET (NFET) or a p-type FET (PFET) can be formed. An NFET and a PFET can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components, including channel lengths and gate dielectric thicknesses.

SUMMARY

In accordance with an embodiment of the present invention, a method of fabricating a plurality of field effect transistors with different threshold voltages is provided. The method includes forming a cover layer on a channel region in a first subset, forming a first sacrificial layer on two or more channel regions in a second subset, forming a second sacrificial layer on one of the two or more channel regions in the second subset, removing the cover layer from the channel region in the first subset, forming a first dummy dielectric layer on the channel region in the first subset, and forming a second dummy dielectric layer on the first dummy dielectric layer and the first sacrificial layer on the channel region in the second subset.

In accordance with another embodiment of the present invention, a method of fabricating a plurality of field effect transistors with different threshold voltages is provided. The method includes forming a first sacrificial layer on two or more channel regions in a second subset, wherein the first sacrificial layer is silicon-germanium oxide (SiGeO), forming a second sacrificial layer on one of the two or more channel regions in the second subset, wherein the second sacrificial layer is silicon-germanium oxide (SiGeO), removing the cover layer from the channel region in the first subset, forming a first dummy dielectric layer on the channel region in the first subset, and forming a second dummy dielectric layer on the first dummy dielectric layer and the first sacrificial layer on the channel region in the second subset.

In accordance with yet another embodiment of the present invention, a plurality of field effect transistors with different threshold voltages is provided. The plurality of field effect transistors with different threshold voltages includes a channel region in a first subset, two or more channel regions in a second subset, a modified interfacial region on the two or more channel regions in the second subset, and a gate dielectric layer on the channel region in the first subset.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 9 is a cross-sectional view showing a heat treatment of the vertical fins, sacrificial layers and dummy dielectric layers, in accordance with an embodiment of the present invention;

FIG. 10 is a cross-sectional view showing a silicon-enriched interface region on the second subset of vertical fins, and enlarged views of the modified sacrificial layer and modified dummy dielectric layer on the vertical fins, in accordance with an embodiment of the present invention;

DETAILED DESCRIPTION

Embodiments of the present invention relate generally to obtaining different threshold voltages for field effect devices by modifying an interface region of the device channels. The interface regions of silicon-germanium channels can have differing amounts of germanium generated by elimination reactions of a dummy silicon-germanium oxide (SiGeO) layer.

Embodiments of the present invention relate generally to heat treating a sacrificial layer including silicon-germanium oxide (SiGeO) to migrate germanium from the channel region towards the channel interface and reduce the trap density at the interface of the SiGe channel and the overlying $SiO_2$ dielectric layer by eliminating GeO.

Embodiments of the present invention relate generally to forming a silicon rich interfacial region on the channel regions of different field effect devices to vary the threshold voltages.

Exemplary applications/uses to which the present invention can be applied include, but are not limited to: logic devices and memory devices.

Figure 1:
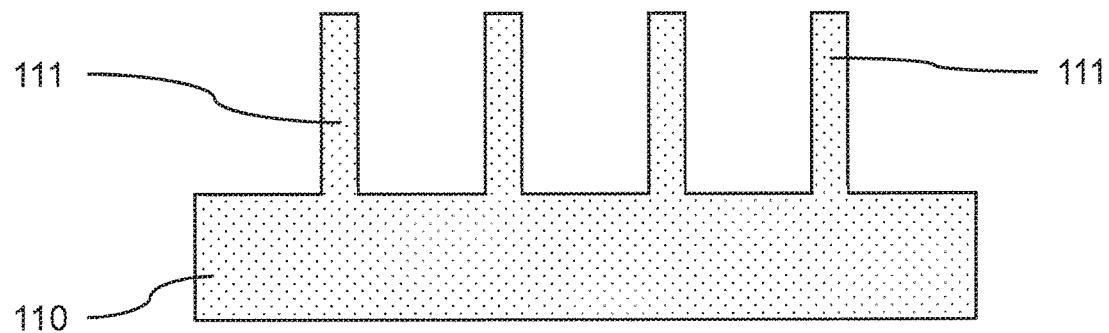
FIG. 1 is a cross-sectional view showing a plurality of vertical fins on a substrate, in accordance with an embodiment of the present invention.

Referring now to the drawings in which like numerals represent the same or similar elements and initially to FIG. 1, a plurality of vertical fins on a substrate is shown, in accordance with an embodiment of the present invention.

In one or more embodiments, a plurality of vertical fins 111 can be formed on a substrate 110, where the vertical fins 111 can be formed by an etching process into the substrate or an epitaxial growth process on the substrate. The vertical fin can form a channel region of a fin field effect transistor (FinFET).

The substrate 110 can be a semiconductor or an insulator with an active surface semiconductor layer. The substrate can include a carrier layer that provides mechanical support for other layers of the substrate. The substrate 110 can include crystalline, semi-crystalline, microcrystalline, or amorphous regions. The substrate 110 can be a silicon wafer. In various embodiments, the substrate can be a single crystal silicon (Si) or silicon germanium (SiGe) wafer, or have a single crystal silicon (Si) or silicon germanium (SiGe) surface/active layer.

In various embodiments, a plurality of vertical fins 111 can be formed by a sidewall image transfer (SIT) process, self-aligned double patterning (SADP) process, or self-aligned quadruple patterning (SAQP) process, to provide a tight pitch between vertical fins 111. In various embodiments, a direct print can be used to provide fin templates from a fin template layer. Immersion Lithography can direct print down to about 78 nm pitch. Extreme ultraviolet lithography (also known as EUV or EUVL), considered a next-generation lithography technology using an extreme ultraviolet (EUV) wavelength, can direct print down to a pitch smaller than 50 nm. Self-aligned double patterning (SADP) can achieve down to about 40 nm to 60 nm fin pitch. Self-aligned quadruple patterning (SAQP) may be used to go down to below 40 nm fin pitch. While the figures illustrate a sidewall image transfer (SIT) process, this is for descriptive purposes, since these other processes are also contemplated, and the scope of the claims and invention should not be limited to the particular illustrated features.

In various embodiments, the vertical fins 111 can be silicon-germanium (SiGe), where the germanium concentration can be in the range of about 20 at. % (atomic percent) to about 75 at. %. The substrate 110 can also be silicon-germanium (SiGe), where the germanium concentration can be in the range of about 20 at. % to about 75 at. %.

Figure 2:
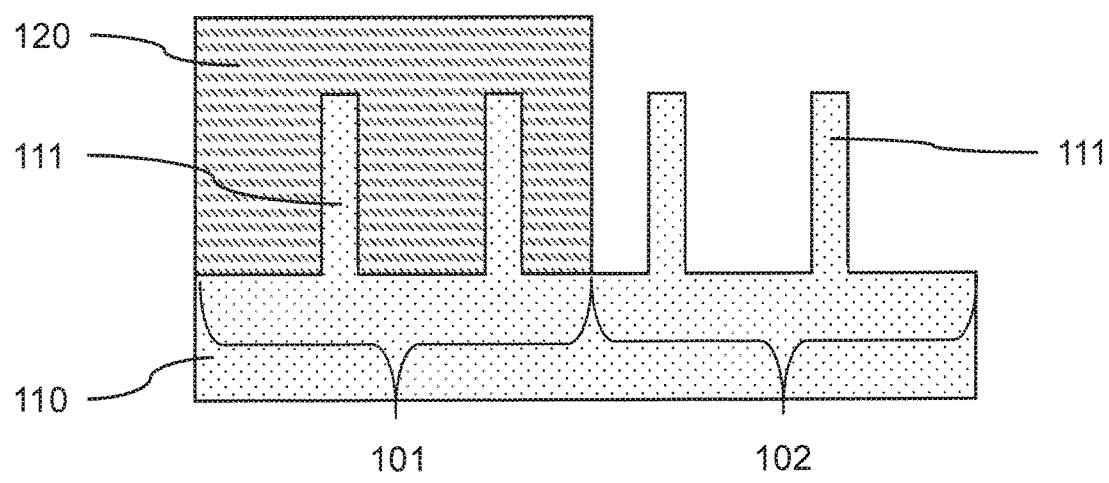
FIG. 2 is a cross-sectional view showing a first cover layer on a portion of the substrate and a first subset of the vertical fins, in accordance with an embodiment of the present invention.

FIG. 2 is a cross-sectional view showing a first cover layer on a portion of the substrate and a first subset of the vertical fins, in accordance with an embodiment of the present invention.

In one or more embodiments, a cover layer 120 can be formed on the substrate 110 and vertical fins 111, where the cover layer can be formed by a blanket deposition. A portion of the cover layer 120 can be removed to expose a second subset of vertical fins 111 on a second region 102 of the substrate, while a first subset of the vertical fins 111 remains masked on a first region 101 of the substrate 110. The cover layer 120 can be a hardmask, for example, a flowable oxide (FOX) or a silicon nitride (SiN). The portion of the cover layer 120 can be removed using lithography and etching processes.

Figure 3:
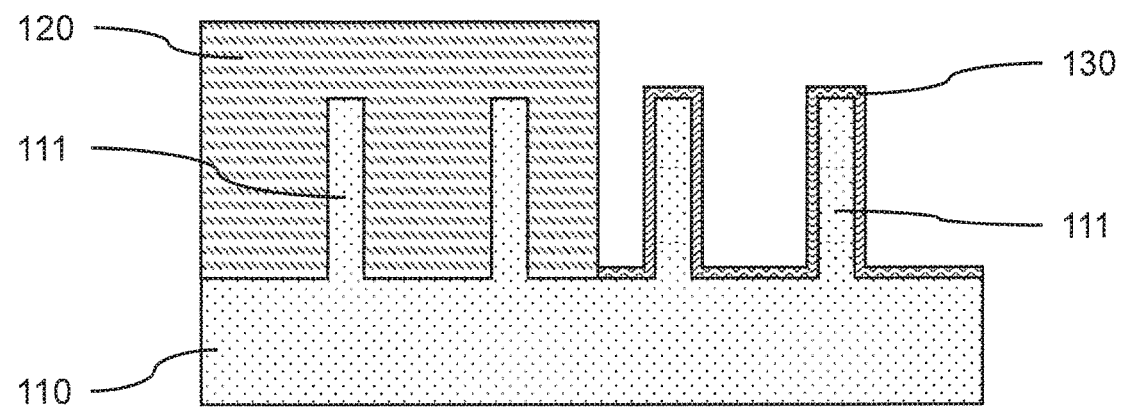
FIG. 3 is a cross-sectional view showing a first sacrificial layer on a portion of the substrate and a second subset of the vertical fins not masked by the cover layer, in accordance with an embodiment of the present invention.

FIG. 3 is a cross-sectional view showing a first sacrificial layer on a portion of the substrate and a second subset of the vertical fins not masked by the cover layer, in accordance with an embodiment of the present invention.

In one or more embodiments, a first sacrificial layer 130 can be formed on the exposed vertical fins 111, where the first sacrificial layer 130 can be formed by atomic layer deposition (ALD), plasma enhanced atomic layer deposition (PEALD), chemical vapor deposition (CVD), plasma enhance chemical vapor deposition (PECVD), or combinations thereof. The first sacrificial layer 130 can be a silicon-germanium oxide (SiGeO), where the germanium concentration is in the range of about 10 at. % (atomic percent) to about 65 at. %, or in the range of in the range of about 20 at. % to about 75 at. %, or in the range of in the range of about 20 at. % to about 65 at. %.

The first sacrificial layer 130 can have a thickness in the range of about 1 nm to about 4.5 nm, or in the range of about 1 nm to about 2 nm.

Figure 4:
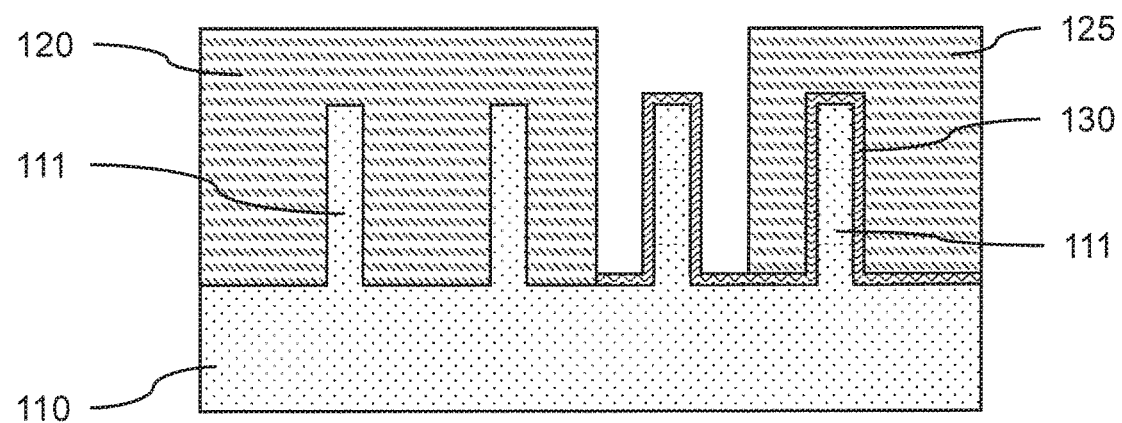
FIG. 4 is a cross-sectional view showing an unmasked vertical fin and a second cover layer on a vertical fin of the second subset, in accordance with an embodiment of the present invention.

FIG. 4 is a cross-sectional view showing an unmasked vertical fin and a second cover layer on a vertical fin of the second subset, in accordance with an embodiment of the present invention.

In one or more embodiments, a second cover layer 125 can be formed on a vertical fin in the second subset, where the second cover layer 125 can be formed on the first sacrificial layer 130. The second cover layer 125 can be blanket deposited and a portion of the second cover layer 125 removed to expose a vertical fin 111 of the second subset. The portion of the second cover layer 125 can be removed by a directional etch, for example, a reactive ion etch (RIE).

Figure 5:
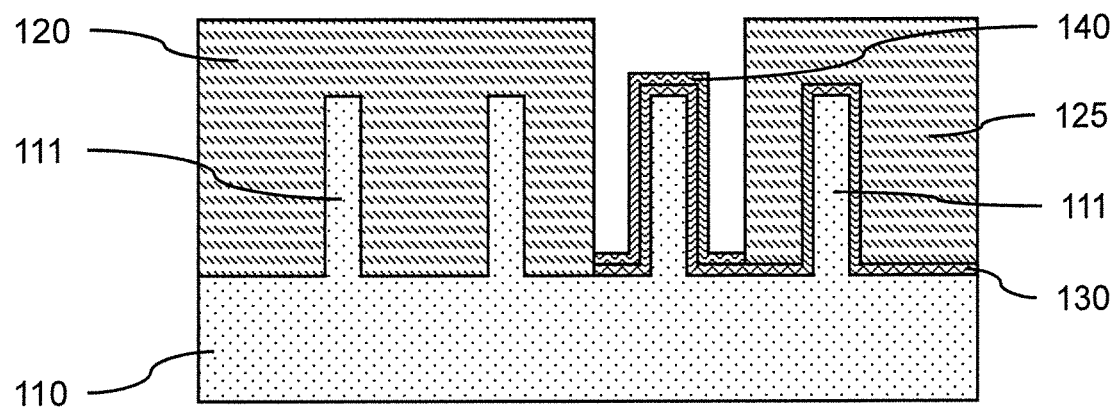
FIG. 5 is a cross-sectional view showing a second sacrificial layer on the first sacrificial layer, in accordance with an embodiment of the present invention.

FIG. 5 is a cross-sectional view showing a second sacrificial layer on the first sacrificial layer, in accordance with an embodiment of the present invention.

In one or more embodiments, a second sacrificial layer 140 can be formed on the exposed portion of the first sacrificial layer 130. The second sacrificial layer 140 can be formed by ALD, PEALD, CVD, PECVD or combinations thereof. The second sacrificial layer 140 can be silicon-germanium oxide (SiGeO), where the second sacrificial layer 140 can have the same germanium concentration as the first sacrificial layer 130 or a different germanium concentration from the first sacrificial layer 130. The second sacrificial layer 140 can have a germanium concentration in the range of about 10 at. % to about 65 at. %, or in the range of in the range of about 20 at. % to about 75 at. %, or in the range of in the range of about 20 at. % to about 65 at. %.

The second sacrificial layer 140 can have a thickness in the range of about 1 nm to about 4.5 nm, or in the range of about 1 nm to about 2 nm. The combined thickness of the second sacrificial layer 140 and the first sacrificial layer 130 can be in the range of about 4 nm to about 5 nm.

Figure 6:
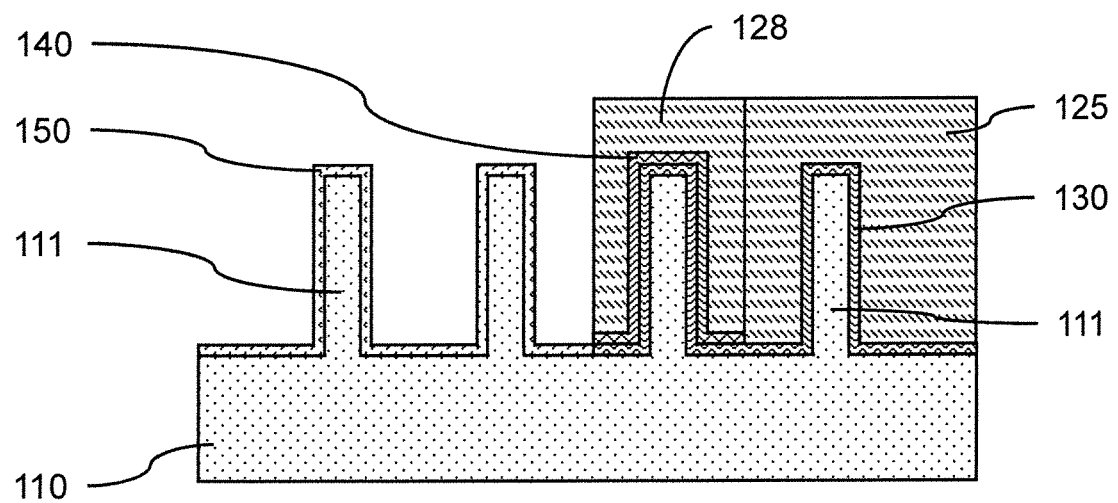
FIG. 6 is a cross-sectional view showing a first dummy dielectric layer on the vertical fins of the first subset after removal of the first cover layer, in accordance with an embodiment of the present invention.

FIG. 6 is a cross-sectional view showing a first dummy dielectric layer on the vertical fins of the first subset after removal of the first cover layer, in accordance with an embodiment of the present invention.

In one or more embodiments, a third cover layer 128 can be formed on the exposed second sacrificial layer 140 on the vertical fin 111 in the second subset. The third cover layer 128 can fill in the gap between the first cover layer 120 and the second cover layer 125, wherein the third cover layer 128 adjoins the second cover layer 125, and the adjacent vertical fins 111 in the second subset are masked by a cover layer 125, 128. The first cover layer 120 can be removed by a lithography and etching process. The vertical fins 111 in the first subset can be exposed by the removal of the first cover layer 120.

In one or more embodiments, a first dummy dielectric layer 150 can be formed on the vertical fins 111 in the first subset exposed by removal of the first cover layer 120. The first dummy dielectric layer 150 can be formed by atomic layer deposition (ALD) or plasma enhanced atomic layer deposition (PEALD) to conformally cover the vertical fins. The first dummy dielectric layer 150 can be silicon dioxide ($SiO_2$).

Figure 7:
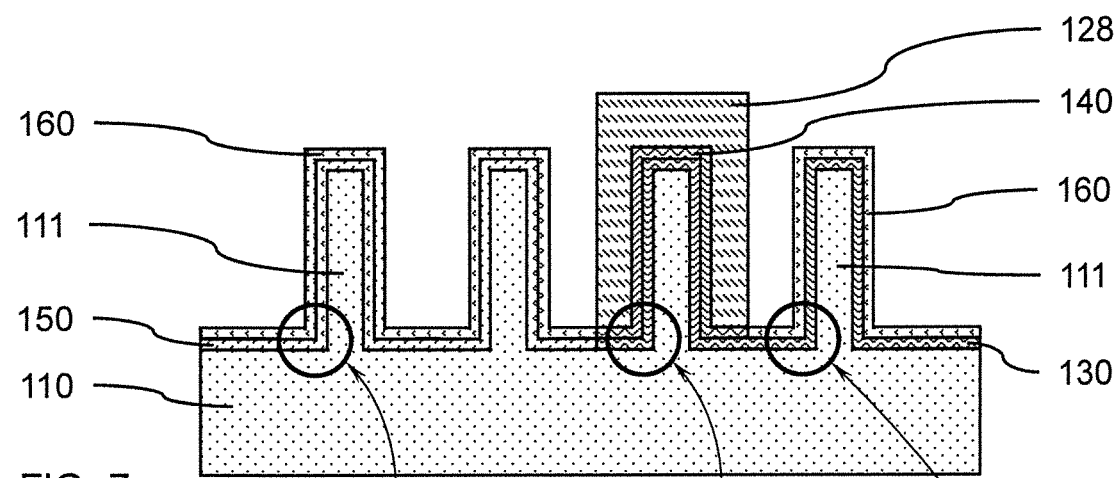
FIG. 7 is a cross-sectional view showing a second dummy dielectric layer on the first dummy dielectric layer and the first sacrificial layer, and enlarged views of the sacrificial layers and dummy dielectric layers on the vertical fins, in accordance with an embodiment of the present invention.

FIG. 7 is a cross-sectional view showing a second dummy dielectric layer on the first dummy dielectric layer and the first sacrificial layer, and enlarged views of the sacrificial layers and dummy dielectric layers on the vertical fins, in accordance with an embodiment of the present invention.

In one or more embodiments, the second cover layer 125 can be removed from a vertical fin 111 in the second subset, where the second cover layer 125 can be removed by a selective masking and etching. The first sacrificial layer 130 on the vertical fin 111 can be exposed by removal of the second cover layer 125, while the second sacrificial layer 140 on another vertical fin in the second subset can remain covered by the third cover layer 128.

In one or more embodiments, a second dummy dielectric layer 160 can be formed on the first dummy dielectric layer 150 on the vertical fins 111 in the first subset and on the exposed first sacrificial layer 130 on the vertical fin 111 in the second subset. The second dummy dielectric layer 160 can be formed by a conformal deposition (e.g., ALD, PEALD). The second dummy dielectric layer 160 can be silicon dioxide ($SiO_2$).

The enlarged views show the combined thicknesses of the sacrificial layers 130, 140 and dummy dielectric layers 150, 160 on the substrate 110 and vertical fins 111 in the first subset and the second subset. The first dummy dielectric layer 150 and second dummy dielectric layer 160 can have a thickness, $W_1$, in the range of about 4 nm to about 5 nm. The first sacrificial layer 130 and second dummy dielectric layer 160 can have a thickness, $W_3$, in the range of about 4 nm to about 5 nm. The first sacrificial layer 130 and second sacrificial layer 140 can have a thickness, $W_2$, in the range of about 4 nm to about 5 nm. The thicknesses, $W_1$, $W_2$, and $W_3$ can be about the same on each vertical fin 111.

Figure 8:
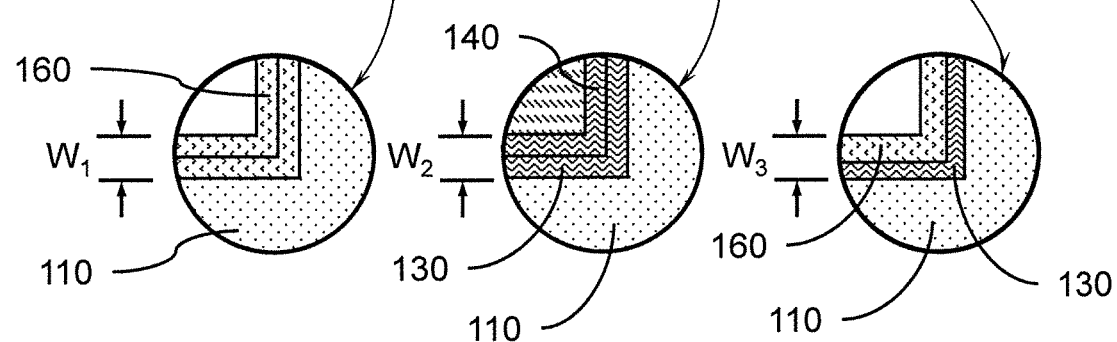
FIG. 8 is a cross-sectional view showing a fill layer on the second dummy dielectric layer and second sacrificial layer, in accordance with an embodiment of the present invention.
Figure 8:
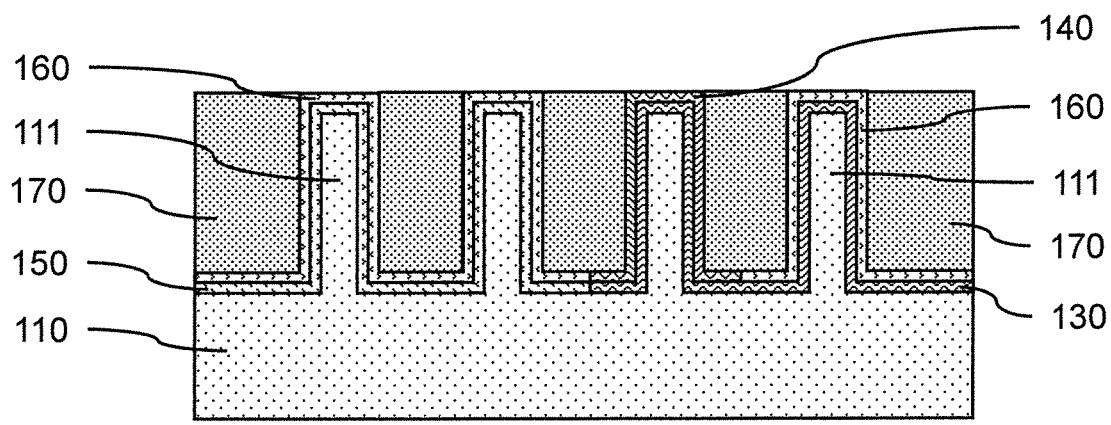

FIG. 8 is a cross-sectional view showing a fill layer on the second dummy dielectric layer and second sacrificial layer, in accordance with an embodiment of the present invention.

In one or more embodiments, the third cover layer 128 can be removed to expose the second sacrificial layer 140 on the vertical fin 111 in the second subset. A fill layer 170 can be formed on the vertical fins 111 and the substrate 110, where the fill layer 170 can be blanket deposited to fill in the spaces between the adjacent vertical fins. The fill layer 170 can be formed over the top surfaces of the second dummy dielectric layer 160 and second sacrificial layer 140 and a chemical-mechanical polishing (CMP) used to remove excess material and expose the top surfaces of the second dummy dielectric layer 160 and second sacrificial layer 140. The fill layer 170 can be amorphous silicon (a-Si).

FIG. 9 is a cross-sectional view showing a heat treatment of the vertical fins, sacrificial layers and dummy dielectric layers, in accordance with an embodiment of the present invention.

In one or more embodiments, a heat treatment can be used to react the substrate 110, sacrificial layers 130, 140, and dummy dielectric layers 150, 160. The heat treatment can cause germanium (Ge) and oxygen (O) to diffuse between the layers to form silicon dioxide ($SiO_2$) and germanium oxide (GeO), where the volatile germanium oxide can diffuse away from the interface regions of the sacrificial layers 130, 140 with the vertical fins 111 and substrate 110.

In various embodiments, the heat treatment can be at a temperature in the range of about 850° C. to about 1250° C., or in the range of about 1000° C. to about 1100° C., or in the range of about 1050° C. to about 1200° C., where a higher Ge percentage can utilize a lower temperature range to initiate the reaction and diffusion to form a modified interfacial region. The heat treatment can be conducted for a period of about 1 second to about 60 seconds, where the heat treatment can be a flash anneal, a rapid thermal anneal (RTA), or a furnace anneal. The volatile GeO can leave the semiconductor material, while leaving silicon at the modified interfacial region.

FIG. 10 is a cross-sectional view showing a silicon-enriched interface region on the second subset of vertical fins and substrate, and enlarged views of the modified sacrificial layer and modified dummy dielectric layer on the vertical fins, in accordance with an embodiment of the present invention.

In one or more embodiments, the heat treatment can form a modified interfacial region 132 between the first sacrificial layer 130 and the adjoining substrate 110 and vertical fins 111. The modified interfacial region 132 can be a region of decreased germanium concentration and decreased interfacial trap concentration, where the modified interfacial region 132 can alter the electrical properties of the channel region formed by the vertical fins 111. The modified interfacial region 132 can have an increased ratio of silicon to germanium due to the out-diffusion of the GeO, to create a modified interfacial region 132 of increased silicon concentration. The silicon-enriched interface region can be on the second subset of vertical fins 111 and substrate 110, where the first sacrificial layer 130 was formed.

The modified interfacial region 132 can have a depth of less than 1 nm (<1 nm), where the modified interfacial region 132 can have a graded change in silicon and germanium concentration. The heat treatment can reduce the $GeO_2$ concentration of the first sacrificial layer 130 and second sacrificial layer 140 if present, while decreasing the germanium concentration to a range of less than about 5 at. % from an initial germanium concentration of about 40 at. % or less. The heat treatment can form a dielectric layer 165, 167 with an increased thickness. The heat treatment can increase the thickness of the second dummy dielectric layer 160, where oxygen separates from the germanium dioxide ($GeO_2$) and forms GeO that leaves the first sacrificial layer 130, and oxygen diffuses to the interfacial region to react with germanium of the substrate 110 to form GeO. The volatile GeO can be eliminated from the SiGeO layers and SiGe substrate and SiGe vertical fins 111 to create the modified interfacial region 132 with decreased Ge concentration. The modified interfacial region 132 can be a modified silicon surface having a silicon concentration in the range of about 80 at. % to about 100 at. %, or about 80 at. % to about 90 at. % at the interface. The thickness of the modified interfacial region 132 can be in the range of about 1 monolayer to about 7 monolayers thick.

The heat treatment can form a combined dummy dielectric layer 165 from the first dummy dielectric layer 150 and second dummy dielectric layer 160, and an enlarged dummy dielectric layer 167 from the first sacrificial layer 130 and the second dummy dielectric layer 160 or the second sacrificial layer 140. The combined dummy dielectric layer 165 and enlarged dummy dielectric layer 167 can be the same thickness after heat treatment. The heat treatment can eliminate the $GeO_2$ from the first sacrificial layer 130 and second sacrificial layer 140, and can form a condensed silicon (Si) layer 134 that is 100 at. % Si at the interface. The condensed Si layer 134 can be about 1 to about 7 monolayers, or about 1 to about 3 monolayers thick.

The enlarged dummy dielectric layer 167 can have a thickness in the range of about 1 nm to about 4.5 nm. The combined dummy dielectric layer 165 can have a thickness in the range of about 1 nm to about 4.5 nm.

Figures 11, 12:
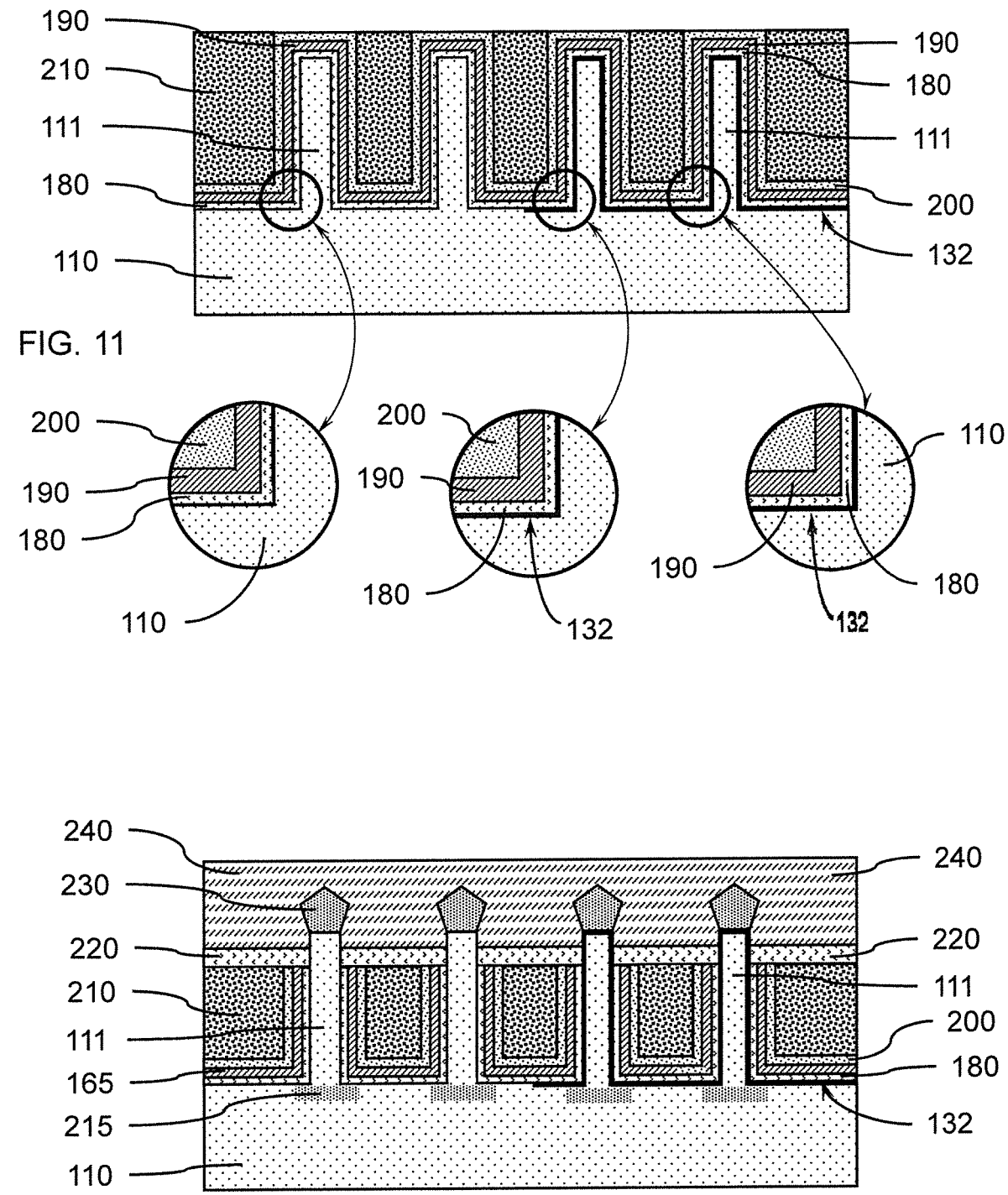
FIG. 11 is a cross-sectional view showing a silicon-enriched interface region on the second subset of vertical fins, gate structures on the vertical fins, and enlarged views of the layers on the vertical fins, in accordance with an embodiment of the present invention.
FIG. 12 is a cross-sectional view showing gate structures and top source/drains on the vertical fins, in accordance with an embodiment of the present invention.

FIG. 11 is a cross-sectional view showing a silicon-enriched interface region on the second subset of vertical fins, gate structures on the vertical fins, and enlarged views of the layers on the vertical fins, in accordance with an embodiment of the present invention.

In one or more embodiments, the fill layer 170 can be removed from the substrate 110 and vertical fins 111, where the fill layer 170 can be removed using a selective etch (e.g., selective wet etch). Removal of the fill layer 170 can expose the underlying enlarged dummy dielectric layer 167 and combined dummy dielectric layer 165. The enlarged dummy dielectric layer 167 and combined dummy dielectric layer 165 can be removed leaving a condensed silicon layer 134 and/or the modified interfacial region 132.

A gate dielectric layer 180 can be formed on the condensed silicon layer 134 and/or the modified interfacial region 132, where the gate dielectric layer can be a silicon oxide (SiO).

A high-K dielectric layer 190 can be formed on the gate dielectric layer 180, where the high-K dielectric can be a material with a dielectric constant greater than $SiO_2$. In an embodiments, the high-K dielectric layer 190 can be hafnium oxide ($HfO_2$). The gate dielectric layer 180 and high-K dielectric layer 190 can be formed by conformal deposition. The gate dielectric layer 180 can have a thickness in the range of about 0.5 nm to about 1 nm. The high-K dielectric layer 190 can have a thickness in the range of about 1.5 nm to about 2.5 nm.

A work function layer 200 can be formed on the high-K dielectric layer 190. The work function layer 200 can be a conductive metal nitride or a conductive metal carbide. The work function layer 200 can have a thickness in the range of about 4 nm to about 10 nm.

A gate fill 210 can be formed on the work function layer 200, where the gate fill 210 can be a conductive material or stack of conductive materials. The conductive gate fill can be a metal conductor, and the work function layer and gate fill can form a conductive gate electrode. The gate fill 210 can be polished by CMP to provide a smooth, flat surface exposing the work function layer 200 or high-K dielectric layer 190. The gate electrode, high-K dielectric layer 190, and gate dielectric layer 180 can form a gate structure.

FIG. 12 is a cross-sectional view showing gate structures and top source/drains on the vertical fins, in accordance with an embodiment of the present invention.

In various embodiments, the height of the gate structure can be reduced to provide for formation of a top spacer layer 220, where the top spacer layer 220 can be blanket deposited and etched back. The top spacer layer 200 can be an insulating dielectric material.

Top source/drains 230 can be formed on the vertical fins 111, and an interlayer dielectric layer 240 can be formed over the top source/drains and gate structures. Bottom source/drains 215 can be formed below one or more of the vertical fins 111 to form vertical transport fin field effect transistors (VT FinFETs).

Figure 13:
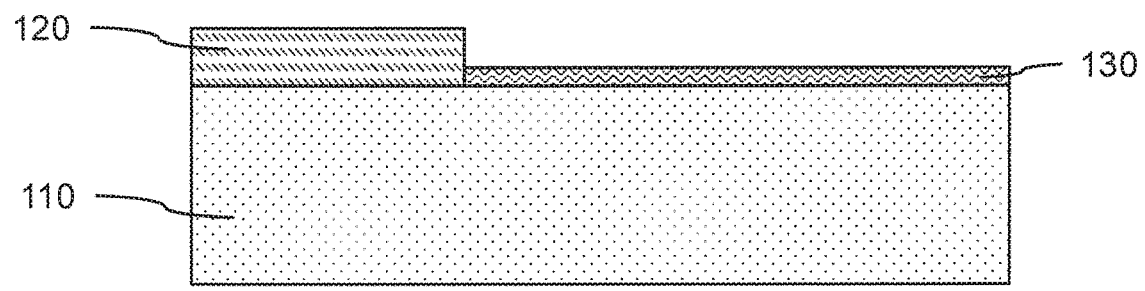
FIG. 13 is a cross-sectional view showing a cover layer and a sacrificial layer on a substrate, in accordance with an embodiment of the present invention.

FIG. 13 is a cross-sectional view showing a cover layer and a sacrificial layer on a substrate, in accordance with an embodiment of the present invention.

In other embodiments, a planar type metal-oxide-semiconductor field effect transistor can be fabricated by forming a first cover layer 120 over a portion of the substrate 110, and forming a first sacrificial layer 130 on the uncovered substrate 110.

Figure 14:
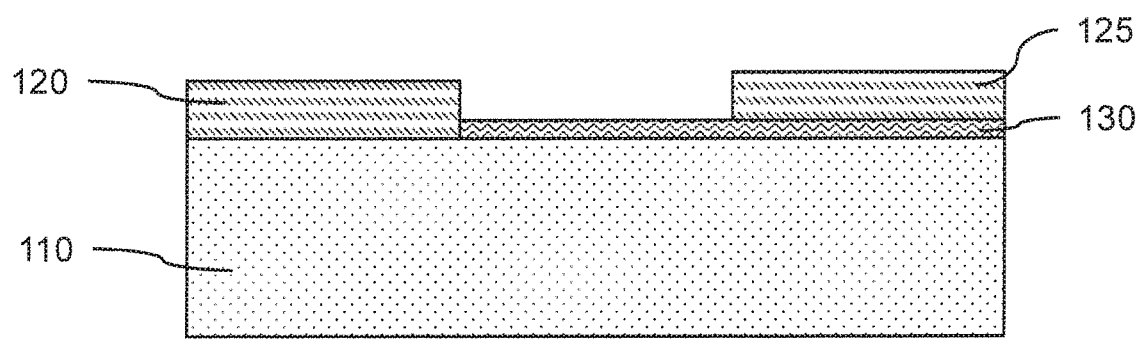
FIG. 14 is a cross-sectional view showing a cover layer on the first sacrificial layer and the substrate, and an exposed portion of the first sacrificial layer, in accordance with an embodiment of the present invention.

FIG. 14 is a cross-sectional view showing a cover layer on the first sacrificial layer and the substrate, and an exposed portion of the first sacrificial layer, in accordance with an embodiment of the present invention.

A portion of the first sacrificial layer 130 can be covered by a second cover layer 125, while leaving a portion of the first sacrificial layer 130 exposed.

Figure 15:
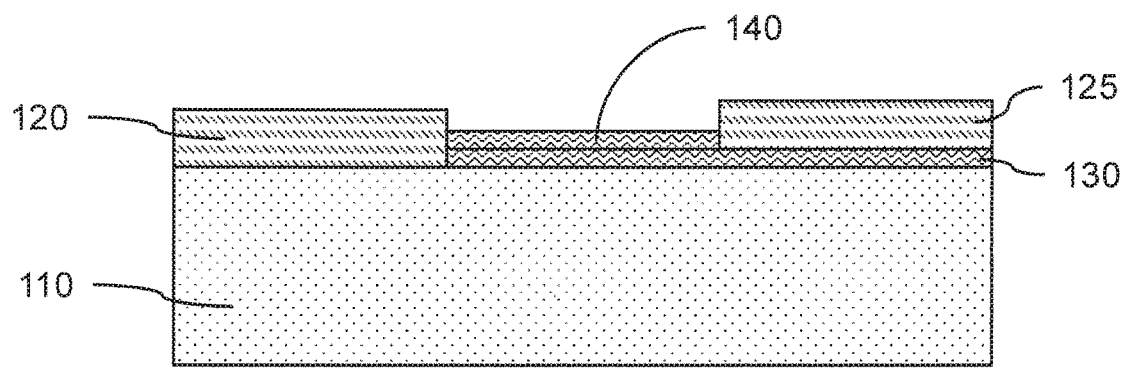
FIG. 15 is a cross-sectional view showing a second sacrificial layer on the exposed portion of the first sacrificial layer, in accordance with an embodiment of the present invention.

FIG. 15 is a cross-sectional view showing a second sacrificial layer on the exposed portion of the first sacrificial layer, in accordance with an embodiment of the present invention.

A second sacrificial layer 140 can be formed on the exposed first sacrificial layer 130. The second sacrificial layer 140 can be formed by CVD or PECVD.

Figure 16:
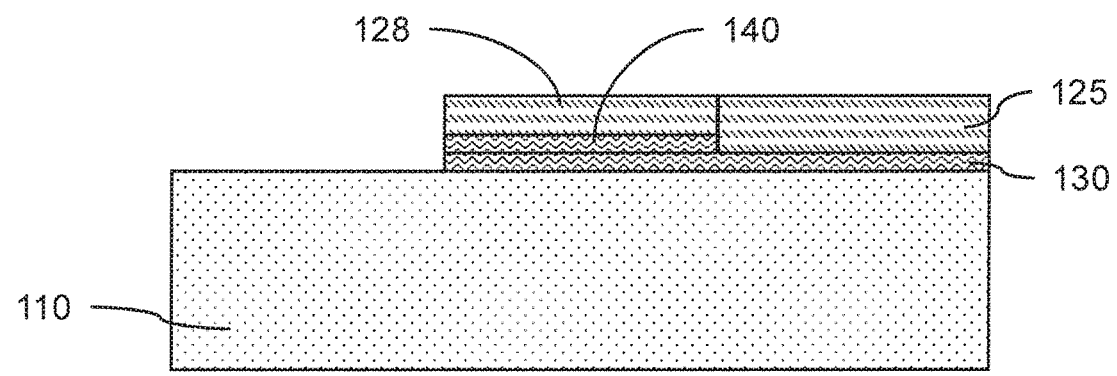
FIG. 16 is a cross-sectional view showing an exposed portion of the substrate, in accordance with an embodiment of the present invention.

FIG. 16 is a cross-sectional view showing an exposed portion of the substrate, in accordance with an embodiment of the present invention.

The first cover layer 120 can be removed to expose the previously masked portion of the substrate 110. A third cover layer 128 can be formed on the second sacrificial layer 140 adjoining the second cover layer 125, where the third cover layer 128 masks the first sacrificial layer 130 and second sacrificial layer 140.

Figure 17:
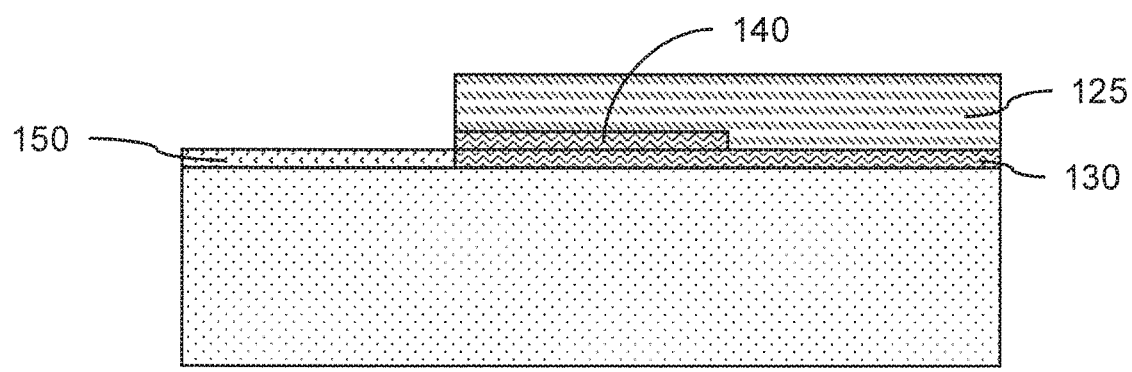
FIG. 17 is a cross-sectional view showing a first dummy dielectric layer on the substrate, and a cover layer on the first and second sacrificial layers, in accordance with an embodiment of the present invention.

FIG. 17 is a cross-sectional view showing a first dummy dielectric layer on the substrate, and a cover layer on the first and second sacrificial layers, in accordance with an embodiment of the present invention.

In one or more embodiments, a first dummy dielectric layer 150 can be formed on the substrate 110 exposed by removal of the first cover layer 120. The first dummy dielectric layer 150 can be formed by atomic layer deposition (ALD) or plasma enhanced atomic layer deposition (PEALD) to conformally cover the exposed substrate.

Figure 18:
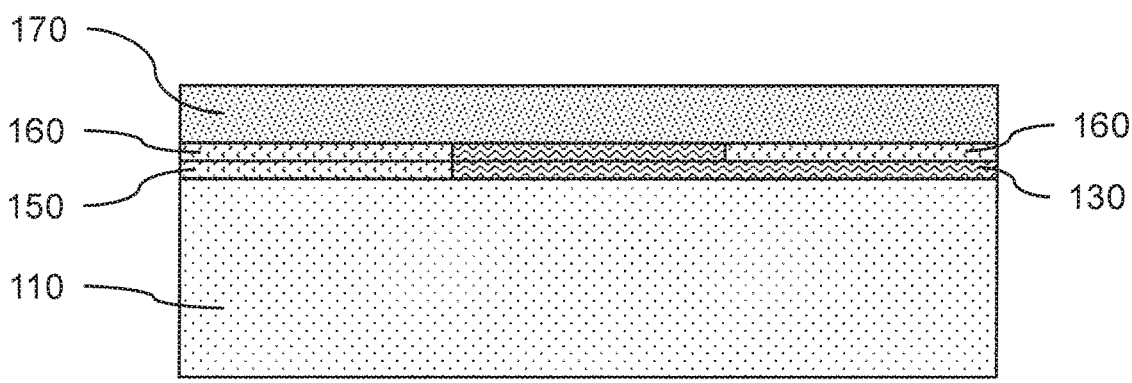
FIG. 18 is a cross-sectional view showing a fill layer on the dummy dielectric layers and sacrificial layers, in accordance with an embodiment of the present invention.

FIG. 18 is a cross-sectional view showing a fill layer on the dummy dielectric layers and sacrificial layers, in accordance with an embodiment of the present invention.

The second cover layer 125 can be removed, and a second dummy dielectric layer 160 can be formed on the first dummy dielectric layer 150 and first sacrificial layer 130. A fill layer 170 can be formed on the second dummy dielectric layer 160 and the second sacrificial layer 140, where the fill layer can form part of a dummy gate.

Figure 19:
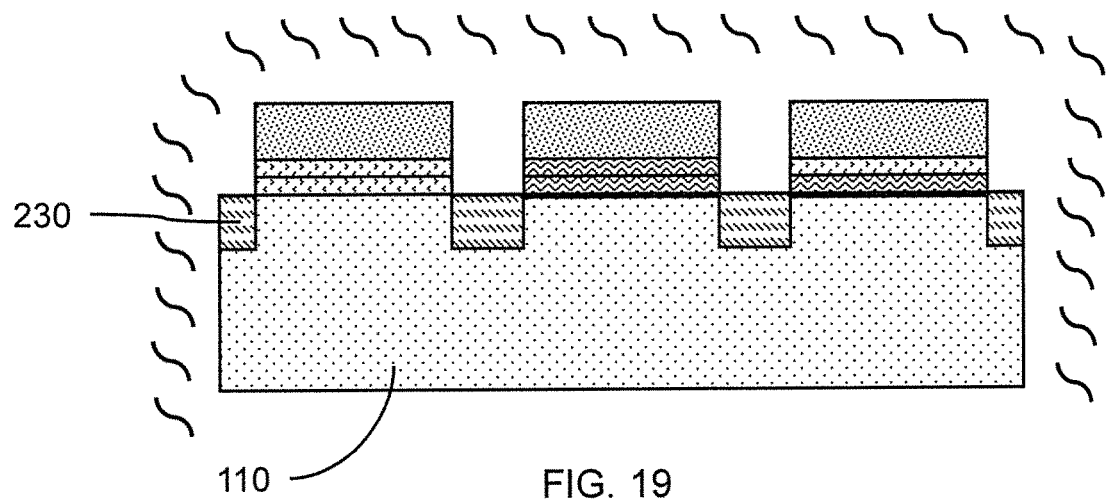
FIG. 19 is a cross-sectional view showing heat treatment of the fill layer, dummy dielectric layers and sacrificial layers, in accordance with an embodiment of the present invention.

FIG. 19 is a cross-sectional view showing heat treatment of the fill layer, dummy dielectric layers and sacrificial layers, in accordance with an embodiment of the present invention.

In various embodiments, portions of the fill layer 170, dummy dielectric layers 150, 160, and sacrificial layers 130, 140 can be removed and an isolation region 230 can be formed between the separated fill layers 170, dummy dielectric layers 150, 160, and sacrificial layers 130, 140. The isolation region 230 can be an electrically insulating material formed in a trench in the substrate 110.

In one or more embodiments, a heat treatment can be used to react the substrate 110, sacrificial layers 130, 140, and dummy dielectric layers 150, 160. The heat treatment can cause germanium (Ge) and oxygen (O) to diffuse between the layers to form germanium oxide (GeO) and silicon (Si), where the germanium oxide can diffuse away from the interface regions of the sacrificial layers 130, 140 with the substrate 110. The fill layer 170, dummy dielectric layers 150, 160, and sacrificial layers 130, 140 can be on channel regions 118 in the substrate 110, where the channel regions can form part of a MOSFET.

In various embodiments, the heat treatment can be at a temperature in the range of about 850° C. to about 1250° C., or in the range of about 1000° C. to about 1100° C., or in the range of about 1050° C. to about 1200° C. The heat treatment can be conducted for a period of about 1 second to about 60 seconds, where the heat treatment can be a flash anneal, a rapid thermal anneal (RTA), or a furnace anneal.

Figure 20:
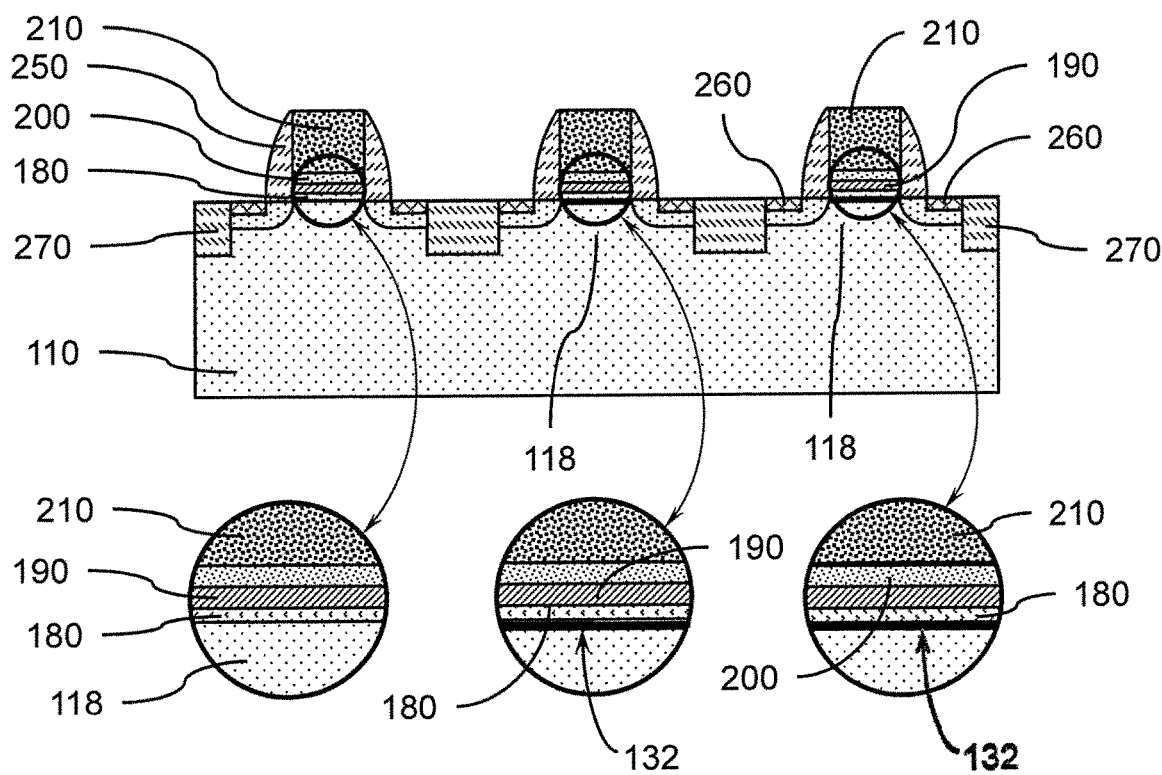
FIG. 20 is a cross-sectional view showing gate structures on channel regions in the substrate, and enlarged views of the layers on the channel regions, in accordance with an embodiment of the present invention.

FIG. 20 is a cross-sectional view showing gate structures on channel regions in the substrate, and enlarged views of the layers on the channel regions, in accordance with an embodiment of the present invention.

In one or more embodiments, the heat treatment can form a modified interfacial region 132 between the first sacrificial layer 130 and the adjoining substrate 110. The modified interfacial region 132 can be a region of decreased germanium concentration and decreased interfacial trap concentration. The modified interfacial region 132 can have a depth of less than 1 nm (<1 nm), where the modified interfacial region 132 can have a graded silicon and germanium concentrations. The heat treatment can reduce the thickness of the first sacrificial layer 130, while decreasing the germanium concentration to a range of about 5 at. % to about 40 at. % depending on the initial germanium concentration. Removal of the Ge can form a condensed Si layer 134 having 100 at. % Si. The heat treatment can also increase the thickness of the second dummy dielectric layer 160, where oxygen from the germanium dioxide ($GeO_2$) forms GeO that leaves the first sacrificial layer 130 and forms $SiO_2$ that increase the thickness of the second dummy dielectric layer.

The heat treatment can form a combined dummy dielectric layer 165 from the first dummy dielectric layer 150 and second dummy dielectric layer 160, and an enlarged dummy dielectric layer 167 from the first sacrificial layer 130 and second dummy dielectric layer 160 or second sacrificial layer 140.

The enlarged dummy dielectric layer 167 can have a thickness in the range of about 1 nm to about 4.5 nm. The combined dummy dielectric layer 165 can have a thickness in the range of about 1 nm to about 4.5 nm.

In various embodiments, gate spacers 250 can be formed on a fill layer 170, dummy dielectric layers 150, 160, and sacrificial layers 130, 140 to form a dummy gate structure. The dummy gate structure can be removed and an active gate structure formed. The enlarged dummy dielectric layer 167 and combined dummy dielectric layer 165 can be removed leaving a condensed silicon layer 134 and/or the modified interfacial region 132. The active gate structure including a gate dielectric layer 180, high-K dielectric layer 190, a work function layer 200, and a gate fill 210, which can be formed on the condensed silicon layer 134 and/or the modified interfacial region 132. Source/drains 260 can be formed in the substrate 110 by doping or implantation. The channel regions can be between the source/drains 260 and below the active gate structure.

Figure 21:
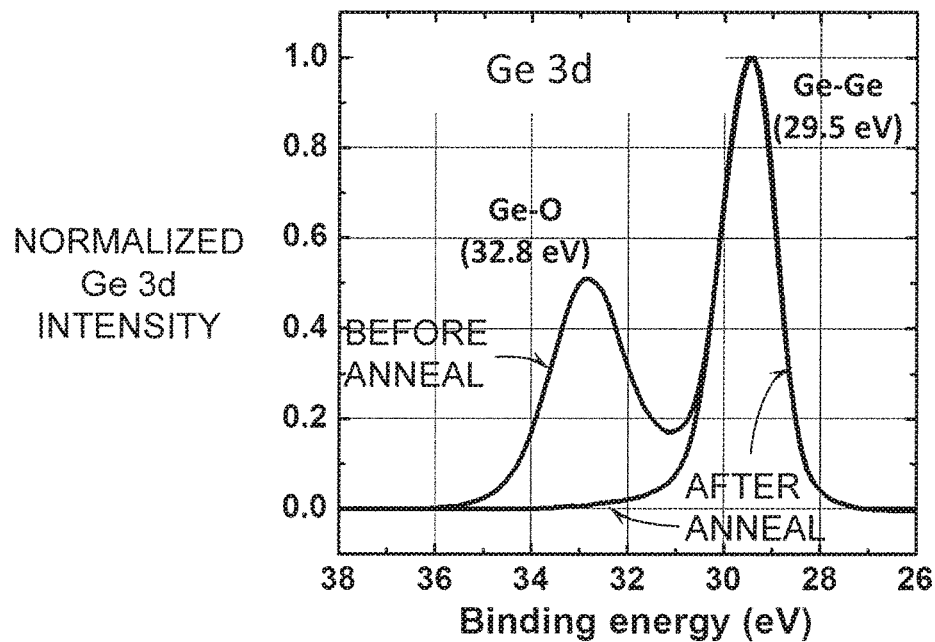
FIG. 21 is an X-ray photoelectron spectroscopy plot for germanium showing the change in chemical composition and environment by heat treatment, in accordance with an embodiment of the present invention.

FIG. 21 is an X-ray photoelectron spectroscopy plot for germanium showing the change in chemical composition and environment by heat treatment, in accordance with an embodiment of the present invention.

The spectrum shows the elimination of the Ge—O band after the anneal indicating elimination of the GeO from SiGeO sacrificial layers 130, 140.

Figure 22:
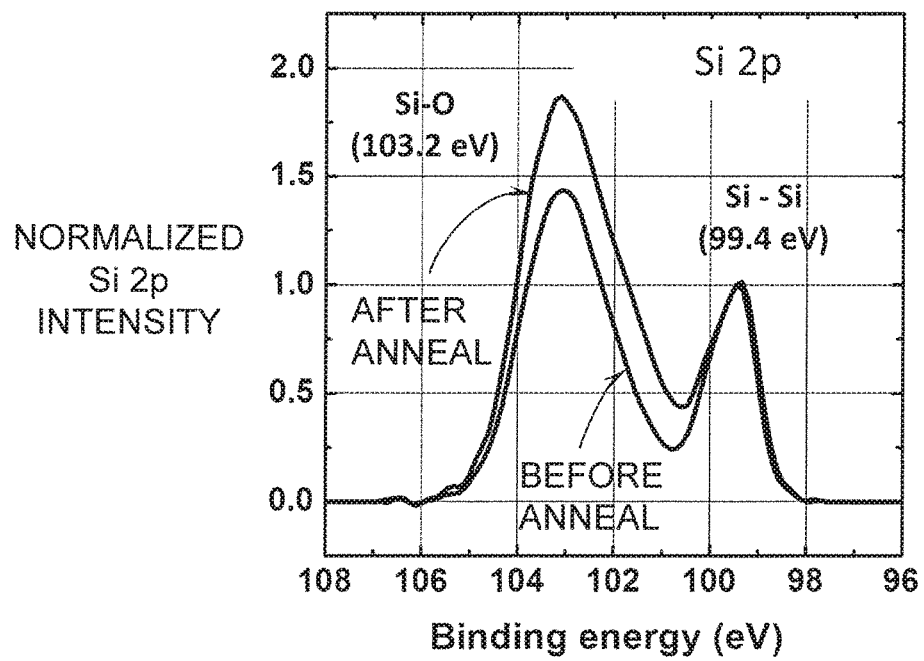
FIG. 22 is an X-ray photoelectron spectroscopy plot for silicon showing the change in chemical composition and environment by heat treatment, in accordance with an embodiment of the present invention.

FIG. 22 is an X-ray photoelectron spectroscopy plot for silicon showing the change in chemical composition and environment by heat treatment, in accordance with an embodiment of the present invention.

The spectrum shows no change in the Si—Si band and an increase in the Si—O band indicting an increase in $SiO_2$ for enlarged dummy dielectric layer 167.

Figure 23:
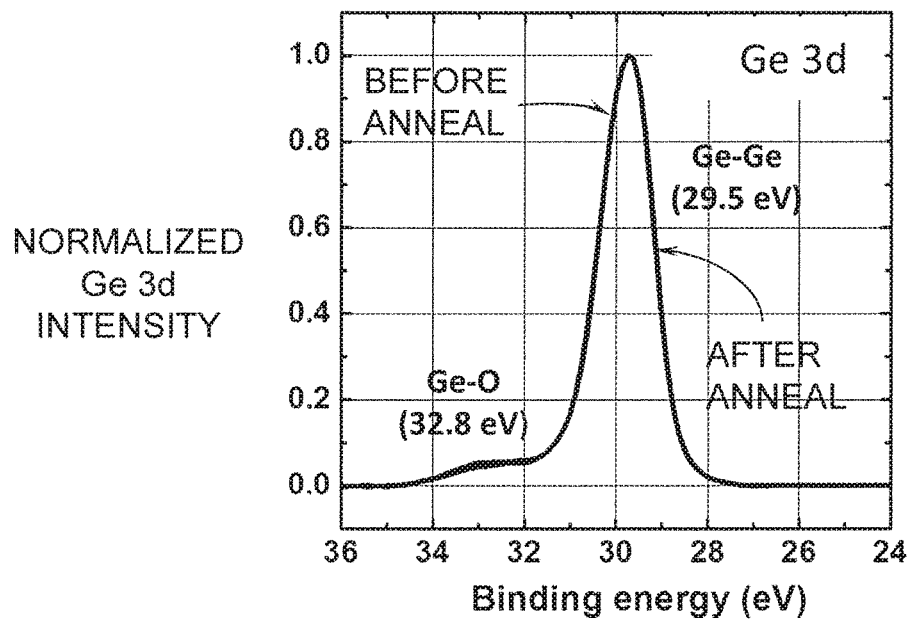
FIG. 23 is an X-ray photoelectron spectroscopy plot for germanium showing the change in chemical composition and environment by heat treatment, in accordance with an embodiment of the present invention.

FIG. 23 is an X-ray photoelectron spectroscopy plot for germanium showing the change in chemical composition and environment by heat treatment, in accordance with an embodiment of the present invention.

The spectrum shows no presence or change in the Ge—O band for germanium oxide (GeO) in the $SiO_2$ dummy dielectric layers 150, 160.

Figure 24:
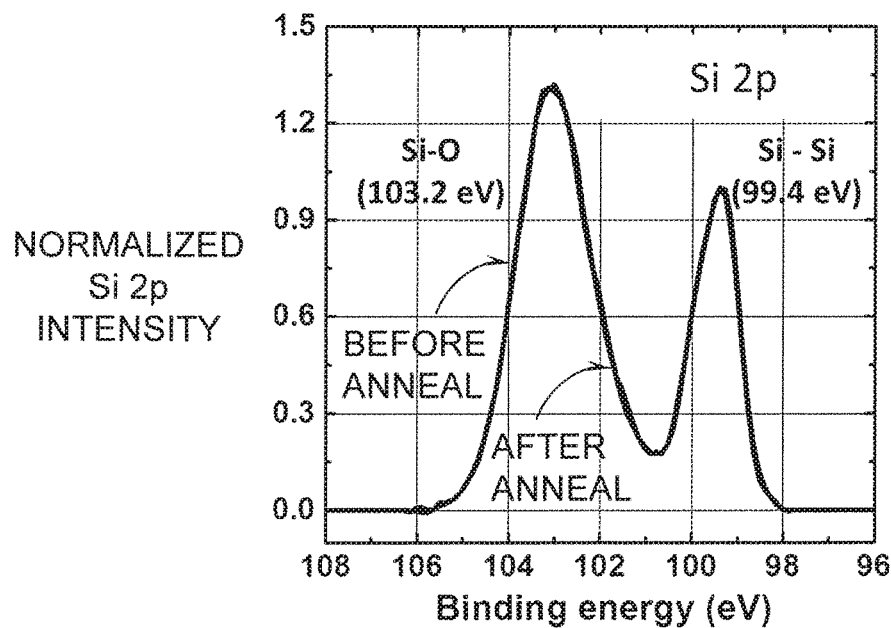
FIG. 24 is an X-ray photoelectron spectroscopy plot for silicon showing the change in chemical composition and environment by heat treatment, in accordance with an embodiment of the present invention.

FIG. 24 is an X-ray photoelectron spectroscopy plot for silicon showing the change in chemical composition and environment by heat treatment, in accordance with an embodiment of the present invention.

The spectrum shows no change in the Si—Si band or Si—O band in the $SiO_2$ dummy dielectric layers 150, 160.

Figure 25:
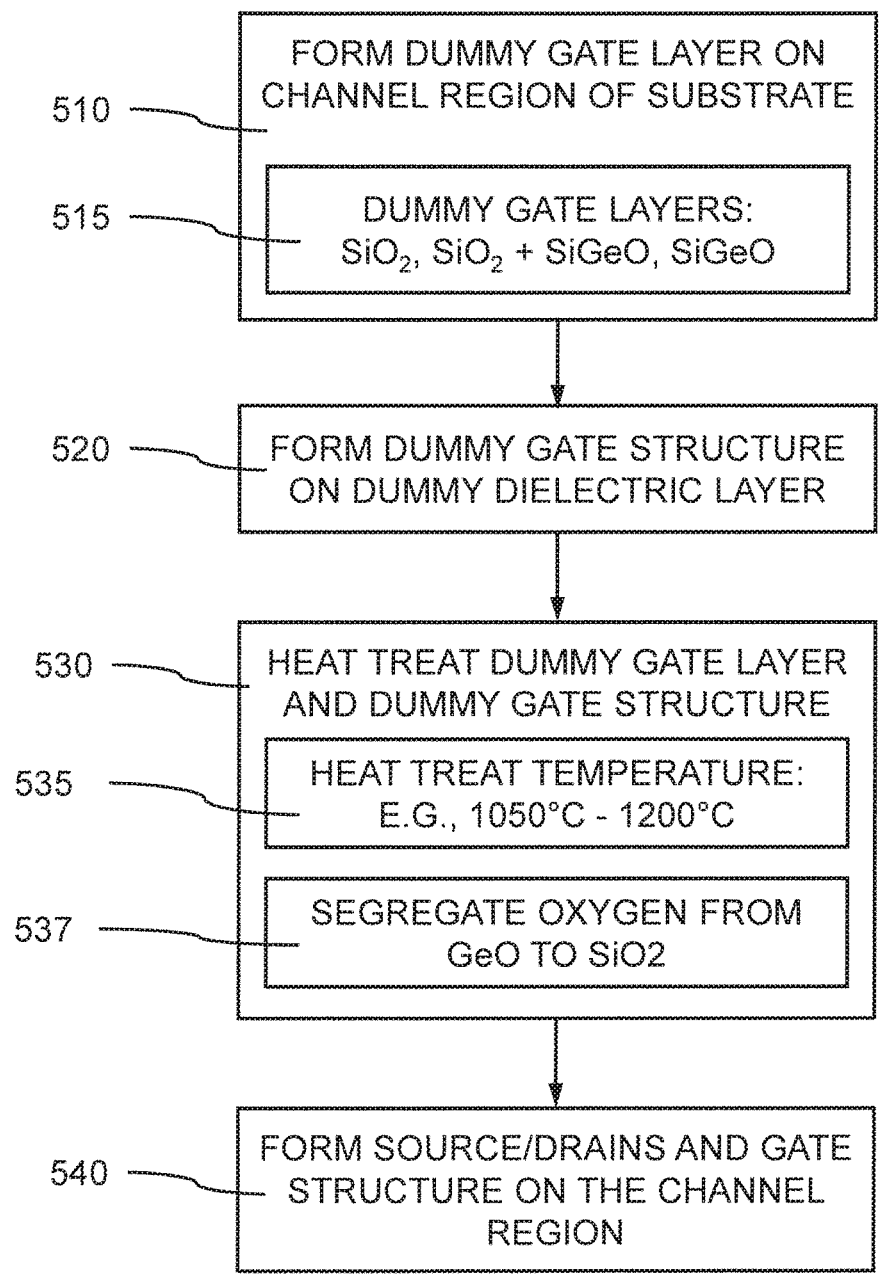
FIG. 25 is a block/flow diagram of a fabrication process for forming modified channel interfaces, in accordance with an embodiment of the present invention.

FIG. 25 is a block/flow diagram of a fabrication process for forming modified channel interfaces, in accordance with an embodiment of the present invention.

Block 510 shows the formation of a dummy gate layer on the channel region of a substrate. The dummy gate layer can include one or more sacrificial layers, one or more dummy dielectric layers, or a combination of a sacrificial layer and a dummy dielectric layer.

Block 515 shows the configuration of the dummy gate layers. The sacrificial layers can be SiGeO, and the dummy dielectric layers can be $SiO_2$. The sacrificial layers can be formed by CVD, PECVD, or a combination thereof. The dummy dielectric layers can be formed by ALD, PEALD, or a combination thereof. The dummy gate layer can be a combination of an SiGeO layer and a $SiO_2$ layer, two SiGeO layers, or two $SiO_2$ layers.

Block 520 shows the formation of a dummy gate structure on the dummy gate layer. The dummy gate structure can include a fill layer that can be later removed and replaced with an active gate structure including gate dielectric layers, a work function layer, and a conductive gate fill.

Block 530 shows the heat treatment of the dummy gate layer and dummy gate structure to form an interfacial region with reduced defects and traps, where the interfacial region is between the channel region and a gate structure.

Block 535 shows the heat treatment can be conducted at a temperature of about 1050° C. to about 1200° C.

Block 537 shows the heat treatment can cause oxygen to migrate from $GeO_2$ to GeO to reduce the Ge concentration at the interfacial region.

Block 540 shows the formation of source/drains and a gate structure on the channel region to form VT FinFETs or MOSFETs with varying threshold voltages based on the amount of germanium removed from the interfacial region, where an unmodified interface has a reference threshold voltage, a partially modified interface has an intermediate threshold voltage shift from the reference threshold voltage, and the highly modified interface has a large threshold voltage shift from the reference threshold voltage. A large threshold voltage shift can be in the range of about 100 mV to about 200 mV from the reference threshold voltage. An intermediate threshold voltage shift can be in the range of about 60 mV to about 100 mV from the reference threshold voltage.

The metal gate thicknesses can be consistent between the devices with unmodified interfaces, partially modified interfaces, and highly modified interfaces because the dummy gate layers can be removed to leave the exposed modified interface, and an active gate structure is formed for all three devices at the same time to avoid gate dielectric and work function thickness variations.

Having described preferred embodiments of the fabrication of field effect transistors with different threshold voltages through modified channel interfaces (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of fabricating a plurality of field effect transistors with different threshold voltages, comprising:
    forming a first cover layer on a semiconductor channel region in a first subset and two or more semiconductor channel regions in a second subset;
    removing a portion of the first cover layer from the two or more semiconductor channel regions in the second subset;
    forming a first sacrificial layer on two or more semiconductor channel regions in a second subset;
    forming a second cover layer on at least one but less than all of the two or more semiconductor channel regions in the second subset, wherein the second cover layer is formed on the first sacrificial layer;
    forming a second sacrificial layer on an exposed portion of the first sacrificial layer on the at least one of the two or more semiconductor channel regions in the second subset;
    removing the first cover layer from the semiconductor channel region in the first subset;
    forming a first dummy dielectric layer on the semiconductor channel region in the first subset; and
    forming a second dummy dielectric layer on the first dummy dielectric layer and the first sacrificial layer on the semiconductor channel region in the second subset not covered by the second cover layer, wherein the second sacrificial layer is adjoining the first dummy dielectric layer.

2. The method of claim 1, wherein the first sacrificial layer is formed by chemical vapor deposition or plasma enhanced chemical vapor deposition.

3. The method of claim 2, wherein the first sacrificial layer is silicon-germanium oxide (SiGeO).

4. The method of claim 2, wherein the first dummy dielectric layer is formed by atomic layer deposition or plasma enhanced atomic layer deposition.

5. The method of claim 4, wherein the first dummy dielectric layer is silicon dioxide ($SiO_2$).

6. The method of claim 1, further comprising heat treating the first sacrificial layer, second sacrificial layer, first dummy dielectric layer, second dummy dielectric layer, semiconductor channel region in the first subset and the semiconductor channel regions in the second subset.

7. The method of claim 6, wherein the heat treatment is conducted at a temperature in the range of about 850° C. to about 1250° C.

8. The method of claim 7, wherein the heat treatment is conducted for a period of about 1 second to about 60 seconds.

9. The method of claim 7, wherein the heat treatment is a flash anneal, a rapid thermal anneal (RTA), or a furnace anneal.

10. A method of fabricating a plurality of field effect transistors with different threshold voltages, comprising:
forming a cover layer on a semiconductor channel region in a first subset and two or more semiconductor channel regions in a second subset, wherein the cover layer is a flowable oxide (FOX) or a silicon nitride (SiN);
removing a portion of the first cover layer from the two or more semiconductor channel regions in the second subset;
forming a first sacrificial layer on the two or more semiconductor channel regions in the second subset, wherein the first sacrificial layer is silicon-geranium oxide (SiGeO);
forming a second sacrificial layer on one of the two or more semiconductor channel regions in the second subset, wherein the second sacrificial layer is silicon-geranium oxide (SiGeO);
removing the cover layer from the semiconductor channel region in the first subset;
forming a first dummy dielectric layer on the semiconductor channel region in the first subset; and
forming a second dummy dielectric layer on the first dummy dielectric layer and the first sacrificial layer on the semiconductor channel region in the second subset.

11. The method of claim 10, further comprising heat treating the first sacrificial layer, second sacrificial layer, first dummy dielectric layer, second dummy dielectric layer, semiconductor channel region in the first subset and the semiconductor channel regions in the second subset.

12. The method of claim 11, wherein the first sacrificial layer and second sacrificial layer have a combined thickness in the range of about 4 nm to about 5 nm.

13. The method of claim 11, wherein the first dummy dielectric layer and second dummy dielectric layer form a combined dummy dielectric layer having a thickness in the range of about 4 nm to about 5 nm.

14. The method of claim 13, wherein the first dummy dielectric layer and second dummy dielectric layer are silicon dioxide ($SiO_2$).

15. The method of claim 14, wherein the heat treatment forms a modified interfacial region with a depth of less than 1 nm between the first sacrificial layer and the semiconductor channel regions in the second subset.

* * * * *